United States Patent
Yu et al.

(10) Patent No.: US 11,910,540 B2
(45) Date of Patent: Feb. 20, 2024

(54) CIRCUIT BOARD WITH SOLDER MASK ON INTERNAL COPPER PAD

(71) Applicant: DSBJ Pte. Ltd., Singapore (SG)

(72) Inventors: Pui Yin Yu, Hong Kong (CN); Hong Tu Zhang, Zhuhai (CN)

( * ) Notice: Subject to any disclaimer, the term of this patent is extended or adjusted under 35 U.S.C. 154(b) by 0 days.

(21) Appl. No.: 17/819,920

(22) Filed: Aug. 15, 2022

(65) Prior Publication Data
US 2023/0328896 A1     Oct. 12, 2023

(30) Foreign Application Priority Data

Apr. 8, 2022  (CN) .......................... 202210364285.1

(51) Int. Cl.
| | |
|---|---|
| H05K 1/02 | (2006.01) |
| H01L 23/13 | (2006.01) |
| H01L 23/58 | (2006.01) |
| H05K 3/34 | (2006.01) |
| H05K 1/11 | (2006.01) |
| H05K 3/46 | (2006.01) |
| H05K 3/24 | (2006.01) |

(52) U.S. Cl.
CPC ........... *H05K 3/3452* (2013.01); *H05K 1/113* (2013.01); *H05K 3/244* (2013.01); *H05K 3/3485* (2020.08); *H05K 3/4697* (2013.01)

(58) Field of Classification Search
CPC ........ H05K 1/02; H05K 1/021; H05K 1/0204; H05K 1/0206; H05K 1/113; H05K 3/244; H05K 3/3452; H05K 3/3485; H05K 3/4069; H05K 3/4614; H05K 3/4623; H05K 3/4652; H05K 3/4697; H01L 21/481; H01L 21/586; H01L 21/561; H01L 21/4846; H01L 21/4857; H01L 23/13; H01L 23/58; H01L 23/3114; H01L 23/3128; H01L 23/3677; H01L 23/49822; H01L 23/49827; H01L 23/49838; H01L 23/49816; H01L 23/5389
USPC .......... 174/255, 264; 438/613; 257/99, 264, 257/675, 711, 712, 717, 737, 738, 758, 257/773, 774, 778
See application file for complete search history.

(56) References Cited

U.S. PATENT DOCUMENTS

| | | | | |
|---|---|---|---|---|
| 6,097,089 A | * | 8/2000 | Gaku | .................. H01L 23/3128 257/E23.105 |
| 6,396,143 B1 | * | 5/2002 | Kimbara | ............. H01L 21/4857 257/784 |
| 8,232,576 B1 | * | 7/2012 | Lin | ..................... H01L 23/3677 257/711 |

(Continued)

*Primary Examiner* — Xiaoliang Chen
(74) *Attorney, Agent, or Firm* — Carlson, Caspers, Vandenburgh & Lindquist, P.A.

(57) ABSTRACT

Embodiments and fabrication methods for a printed circuit board comprising two or more electrically conductive layers, including at least a first conductive layer opposing and adjacent to a second conductive layer. Also including one or more electrically non-conductive layers including at least a first non-conductive layer disposed between the first conductive layer and the second conductive layer. A first copper pad is included on the first conductive layer. A second copper pad is included on the second conductive layer. There is a conductive via extending through the first non-conductive layer and electrically connecting the first copper pad to the second copper pad and solder mask material on the first copper pad around the via.

8 Claims, 3 Drawing Sheets

(56) References Cited

U.S. PATENT DOCUMENTS

2005/0269698 A1* 12/2005 Okada ................ H01L 23/3114
257/737
2014/0231126 A1* 8/2014 Hunrath ............... H05K 3/4069
174/264
2020/0111732 A1* 4/2020 Kanbe ............... H01L 23/49822

* cited by examiner

CIRCUIT BOARD WITH SOLDER MASK ON INTERNAL COPPER PAD

RELATED APPLICATIONS

This application claims priority to Chinese Patent Application No. 202210364285.1, filed Apr. 8, 2022, entitled "CIRCUIT BOARD WITH SOLDER MASK ON INTERNAL COPPER PAD", which is hereby incorporated herein by reference.

FIELD OF THE INVENTION

The present invention is generally directed to printed circuit boards. More specifically, the present invention is directed to printed circuit boards having solder mask on internal copper pads.

BACKGROUND

A printed circuit board (PCB) mechanically supports and electrically connects electronic components using conductive traces, pads and other features etched from electrically conductive sheets, such as copper sheets, laminated onto a non-conductive substrate. Multi-layered printed circuit boards are formed by stacking and laminating multiple such etched conductive sheet/non-conductive substrates. Conductors on different layers are interconnected with plated-through holes or holes filled with conductive material called vias.

A PCB includes a plurality of stacked layers (stack-ups). The stack-ups are made of alternating non-conductive layers and conductive layers. The non-conductive layers can be made of prepreg or base material, that is part of a core structure, or simply core. A base material is a fully cured organic or inorganic material used to support a pattern of conductive material. A core is a metal clad base material where the base material has integral metal conductor material on one or both sides. Prepreg is a fibrous reinforcement material impregnated or coated with a resin binder and consolidated and partially cured to an intermediate stage semi-solid product. Prepreg is used as an adhesive layer to bond discrete layers of multilayer PCB construction, where a multilayer PCB consists of alternative layers of conductors and base materials bonded together, including at least one internal conductive layer.

One method of fabricating a multilayer PCB is by forming two separate stack-ups and then laminating the two stack-ups together to form a single larger stack-up. This process of laminating two sub-PCB stack-ups together can be repeated multiple times during the fabrication of a single PCB. The two sub-PCB stack-ups can be bonded together by placing a layer of prepreg between the two stack-ups and laminating the two stack-ups together with prepreg in between. Vias can be formed between the two stack-ups to electrically connect them together. These vias can be formed by laser ablating a cavity in a prepreg layer in between the two stack-ups and placing conductive paste in the cavity. The conductive paste is sintered during the lamination cycle to form a solid via.

Sometimes the via between stack-ups doesn't form properly, such that the electrical connection between the stack-ups will be open and non-operable or sub-optimally operable. One reason open connections occur is the lamination step can force prepreg resin between the conductive paste and the copper pads which the conductive paste is intended to make solid contact with. When the initial stage of the lamination cycle occurs, the conductive paste has not been sintered. During lamination, as the prepreg resin melts, it can flow into the via between the conductive paste and the copper pad. Once the prepreg resin is cured, it becomes an insulator between the conductive paste and the copper pad preventing or hindering the desired connection. Therefore, improvements are desirable.

BRIEF DESCRIPTION

Embodiments and methods for fabricating printed circuit boards include using solder mask material internal to a PCB to ensure solid electrical contacts are made in multilayer PCBs. In a first embodiment, a multilayer PCB is made up of a first and second stack-up, each including a plurality of conductive and non-conductive layers. The two stack-ups are to be joined together with electrical connections made between them. On the first stack-up, a solder mask material is applied to a copper pad on what will be an internal layer of the final PCB. This solder mask is cured and will not substantially melt or flow during later lamination. A layer of prepreg is applied to the first stack-up over the internal layer of the first stack-up. Next, a cavity is formed through the prepreg and the solder mask, exposing the copper pad. The via is filled with conductive paste. Finally, the first stack-up is joined to the second stack-up by aligning the conductive paste with a copper pad on the second stack-up and laminating them together, and sintering the conductive paste to make a solid connection between the two copper pads. The solder mask ensures that prepreg resin does not create an insulating barrier between the conductive paste and the copper pads. In a second embodiment, the process of applying solder mask to a copper pad prior to applying prepreg is also carried out on the second stack-up. The second stack-up, like the first will then have a via formed, filled with conductive paste, and the two stack-ups will be laminated together. The conductive paste from both stack-ups will be sintered and a monolithic, solid connection is made. The solder mask adjacent to both copper pads ensures solid contact between them.

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features that are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

DRAWINGS

Understanding that the drawings depict only exemplary embodiments and are not therefore to be considered limiting in scope, the exemplary embodiments will be described with additional specificity and detail through the use of the accompanying drawings, in which.

DETAILED DESCRIPTION

The subject matter described herein provides for a new process flow and a corresponding PCB produced thereby that enables more reliable conductive contact in a via between sub-PCB stack-ups by reducing open contacts due to insulating prepreg resin. To achieve this, a copper pad on an internal conductive layer of a stack-up can be printed with solder mask to hinder flow of prepreg resin between conductive paste used to form the via and a corresponding copper pad.

Figure 1:
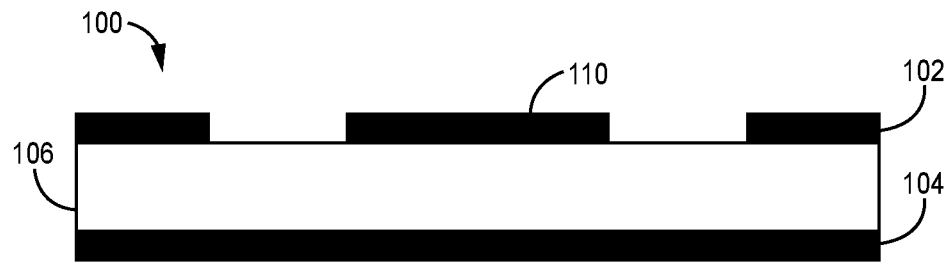
FIG. 1 is a cross-sectional view of an example of a first stack-up that can be used for fabricating a PCB as described herein.

FIG. 1 is a cross-sectional view of an example of a first stack-up 100 that can be used in a process of fabricating a PCB with more reliable conductive contact between conductive paste and corresponding copper pads. The stack-up 100 includes one or more conductive layers 102, 104 separated by one or more respective non-conductive layers 106. Each non-conductive layer 106 in the stack-up 100 is made of a non-conductive material, such as a base material or prepreg. Base material and prepreg each include resin and glass cloth, but the resin in base material is already fully cured and as such does not flow during lamination. The example first stack-up 100 shown in FIG. 1 includes two conductive layers 102, 104 and a single non-conductive layer 106 in between the conductive layers 102, 104. In other examples, only a single conductive layer (i.e., on a single surface of the non-conductive layer 106) is included. In yet other examples, more than two conductive layers are included and multiple non-conductive layers are also included in between each respective conductive layer. Each conductive layer 102, 104 can be patterned to form electrically conductive interconnects. The conductive layer 102 will be an internal layer of the final PCB and it includes a copper pad 110 that is to be electrically coupled to a second stack-up to form larger stack-ups or the final PCB.

Figure 2:
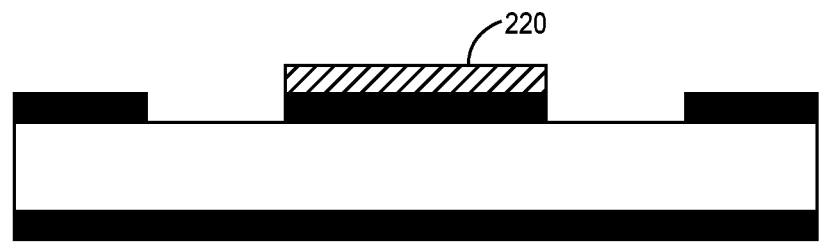
FIGS. 2-6 are cross-sectional views of stages in fabricating the first stack-up for joining it to a second stack-up.

Referring to FIG. 2, a cross-sectional view of the first stack-up in a stage of fabricating is shown. Solder mask material 220 is placed (e.g., printed) onto the copper pad 110 of internal conductive layer 102. The solder mask material (SM) 220 is a material that remains sufficiently solid during lamination cycles of fabrication of the PCB. In an example, the SM 220 does not melt up to a temperature of about 300 degrees C. SM 220 includes materials such as resin, epoxy, or commercially available solder mask materials including liquid photoimageable ink, dryfilm photoimageable solder mask and epoxy liquid. This can be achieved by curing resin or epoxy prior to the lamination step. If the material pre-curing would melt during the lamination step, it should be cured prior to the lamination step to perform its function. The SM 220 binds to copper pad 110.

Figure 3:
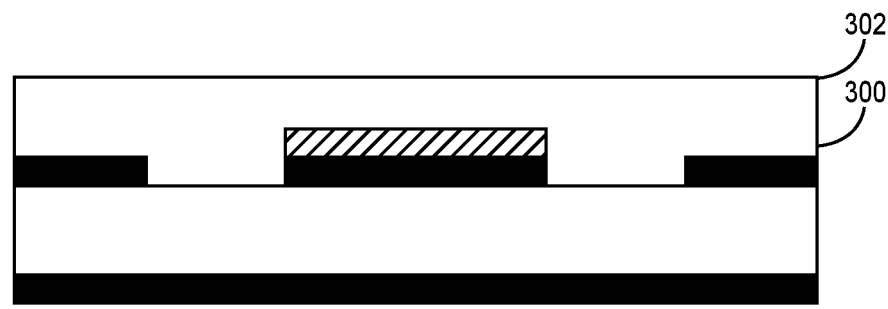

Referring to FIG. 3, the first stack-up is shown during a subsequent step in fabricating. A prepreg layer 300 is applied to the first stack-up 100 overtop of the conductive layer 102 and SM 220. As an example, prepreg layer 300 is a fast laminate prepreg with a PET film 302. Prepreg 300 is used as an adhesive layer to bond the first stack-up 100 to a second stack up during lamination and provide insulation between conductive layer 102 and a conductive layer on a mating surface of the second stack-up. Prepreg 300 is a fibrous reinforcement material impregnated or coated with a resin binder, that is consolidated and partially cured to an intermediate stage semi-solid product. The resin in prepreg 300 is only partially cured and therefore flows during lamination. The PET film 302 can be removed prior to lamination.

Figure 4:
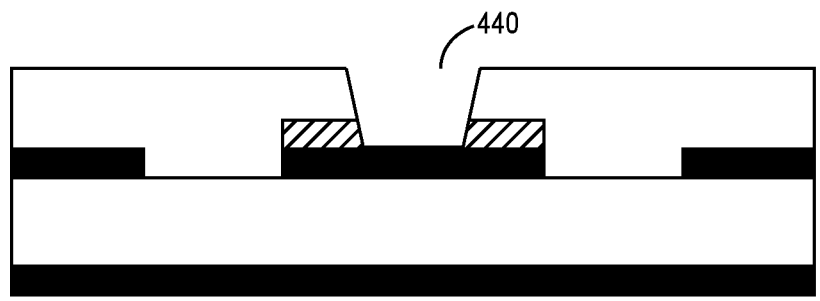

Referring to FIG. 4, the first stack-up is shown during a subsequent step in fabricating. A cavity 440 is formed in the prepreg 300, PET film 302 and the SM 220, exposing internal copper pad 110. Forming the cavity 440 includes forming an aperture through the PET film 302, an aperture through the prepreg 300, and an aperture through the SM 220. The cavity 440 can be disposed such that the PET film 302, prepreg 300, and SM 220 are present entirely around the cavity 440 at their respective layers. That is, the SM 220, prepreg 300, and PET film 302 encircle the cavity 400. Forming the cavity 440 may be accomplishing by laser drilling, such as $CO_2$, Nd:YAG, or other acceptable laser drilling methods. In some examples, the cavity is wider at the top (near PET film 302) than at the bottom (near copper pad 110) because the cavity is formed sequentially from top to bottom by removing material.

Figure 5:
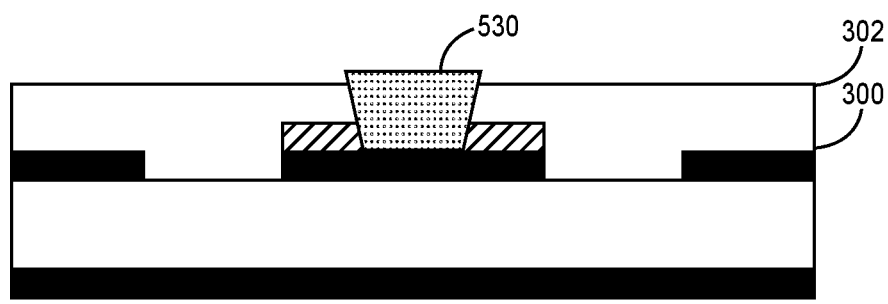

Referring to FIG. 5, the first stack-up is shown during a subsequent step in fabrication. Conductive paste 530 is placed in the cavity 440 making contact with copper pad 110, adjacent SM 220. Placing conductive paste 530 in the cavity 440 can include filling the cavity 440 with conductive paste 530 up to an upper surface of the prepreg 300 or PET film 302. The conductive paste may be made up of copper, silver or other conductive material which can be sintered to form a conductive connection between conductive layers in a PCB. Examples are Ormet® from Merck and MPA500 from Tatsuta.

Figure 6:
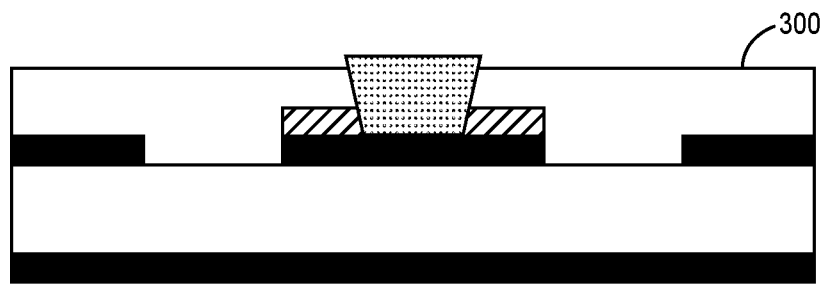

Referring to FIG. 6, the first stack-up is shown during a subsequent step in fabrication. The PET film 302 is removed exposing the prepreg 300 for later lamination.

Figure 7:
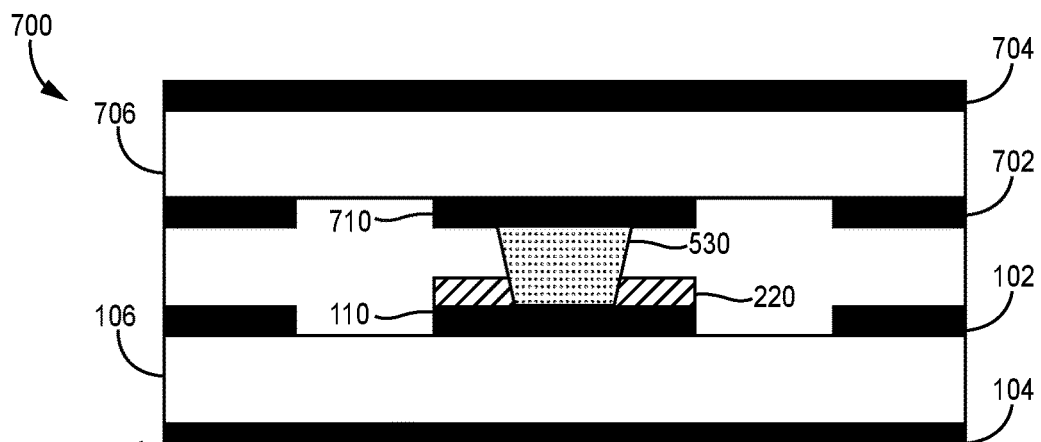
FIG. 7 is a cross-sectional view of the first stack-up joined with a second stack-up according to one embodiment.

Referring to FIG. 7, a second stack-up 700 is aligned with the first stack-up 100 for lamination. The second stack-up 700 includes one or more conductive layers 702, 704, and one or more non-conductive layers 706. The example second stack-up 700 shown in FIG. 7 includes two conductive layers 702, 704 and a single non-conductive layer 706 in between the conductive layers 702, 704. In other examples, only a single conductive layer (i.e., on a single surface of the non-conductive layer 706) is included. In yet other examples, more than two conductive layers are included and multiple non-conductive layers are also included in between each respective conductive layer. Each conductive layer 702, 704 can be patterned to form electrically conductive interconnects.

The two stack-ups 100, 700 are arranged so that conductive layers 102 and 702 are opposing and adjacent one another, rather than facing away from one another with the prepreg layer 300 between the conductive layer 702 and the conductive layer 102. The second stack-up 700 is also aligned with the first stack-up 100 so that a second internal copper pad 710 of the second stack-up 700 contacts the exposed surface of the conductive paste 530 of the first stack-up 100. Once the stack-ups 100, 700 are aligned, the first stack-up 100 and the second stack-up 700 are laminated together under high pressure. During lamination, the stack-ups 100, 700 are pressed tightly together and the prepreg 300 bonds the stack-ups 100, 700 together. During lamination, the SM 220 remains sufficiently solid forming a barrier around a base of the conductive paste 530 that inhibits resin of prepreg 300 from flowing between conductive paste 530 and copper pad 110. The conductive paste 530 is sintered during lamination forming a monolithic, solid structure and an electrical connection between the copper pad 110 of the first stack-up 100 and the copper pad 710 of the second stack-up 700. In an example, lamination of the first stack-up 100 to the second stack-up 700 is performed at a temperature in the range of 100 to 300 degrees C. and at a pressure in the range of 100 to 500 psi.

Figure 8:
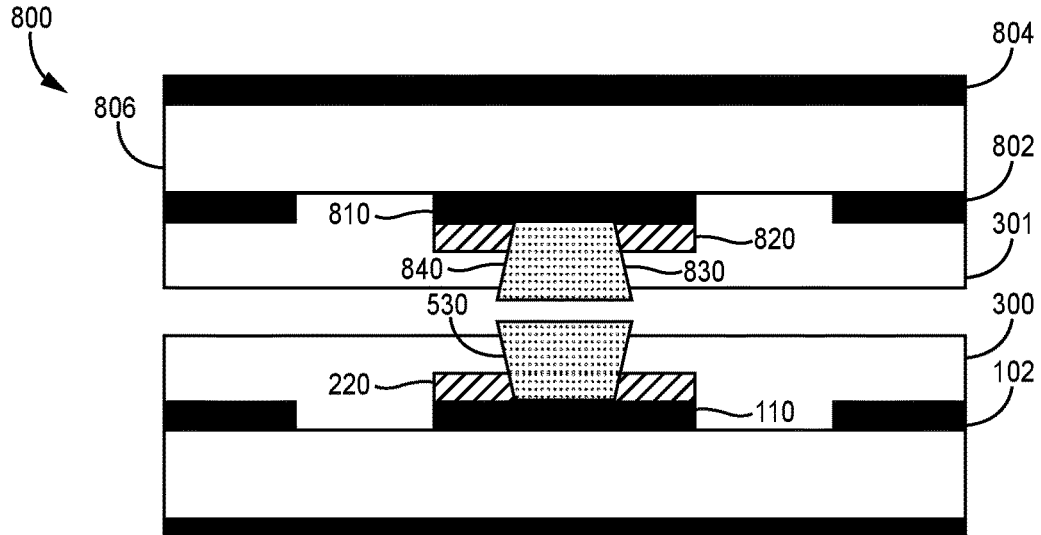
FIGS. 8 and 9 are cross-sectional views of stages in another example process for fabricating a PCB.

FIG. 8 is a cross-sectional view of an alternative embodiment in which the first stack-up 100 is aligned with and laminated to a third stack-up 800. Similar to the first and second stack-ups 100, 700, the third stack-up 800 includes one or more conductive layers 802, 804, and one or more non-conductive layers 806. The example third stack-up 800 shown in FIG. 8 includes two conductive layers 802, 804 and a single non-conductive layer 806 in between the conductive layers 802, 806. In other examples, only a single conductive layer (i.e., on a single surface of the non-conductive layer 806) is included. In yet other examples, more than two conductive layers are included and multiple non-conductive layers are also included in between each respective conductive layer. Each conductive layer 802, 804 can be patterned to form electrically conductive interconnects. In this embodiment, the third stack-up 800 includes a SM 820 on a copper pad 810 of the conductive layer 802 and conductive paste 830 in a cavity 840 through prepreg 301 and SM 820. The third stack-up 800 can be fabricated in the same manner as the first stack-up 100 described above with respect to FIGS. 1-6. In another embodiment, cavity 840 may be formed through SM 820, without a second prepreg layer, exposing copper pad 810. Conductive paste 830 is still placed in cavity 840 making contact with copper pad 810.

For lamination, the two stack-ups 100, 800 are aligned such that connection between conductive paste on the first stack-up 530 and conductive paste on the third stack-up 830 can be made. The two stack-ups 100, 800 are arranged so that conductive layers 102 and 802 are opposing and adjacent one another, rather than facing away from one another with the prepreg layer 300 and prepreg layer 301 between the conductive layer 802 and the conductive layer 102. The third stack-up 800 is also aligned with the first stack-up 100 so that the exposed surface of the conductive paste 830 of the third stack-up 800 contacts the exposed surface of the conductive paste 530 of the first stack-up 100. Once the stack-ups 100, 800 are aligned, the first stack-up 100 and the third stack-up 800 are laminated together under high pressure. During lamination, the stack-ups 100, 800 are pressed tightly together and the prepreg 300, 301 bonds the stack-ups 100, 800 together. During lamination, the SM 220 remains sufficiently solid forming a barrier around a base of the conductive paste 530 that inhibits resin of prepreg 300 from flowing between conductive paste 530 and copper pad 110. Similarly, SM 820 remains sufficiently solid during lamination forming a barrier around a base of the conductive paste 830 that inhibits resin of prepreg 300, 301 from flowing between conductive paste 830 and copper pad 810. The conductive pastes 530, 830 in both stack-ups are sintered during lamination forming a monolithic, solid structure and an electrical connection between the copper pad 110 of the first stack-up 100 and the copper pad 810 of the third stack-up 800. In an example, lamination of the first stack-up 100 to the third stack-up 800 is performed at a temperature in the range of 100 to 300 degrees C. and at a pressure in the range of 100 to 500 psi.

Figure 9:
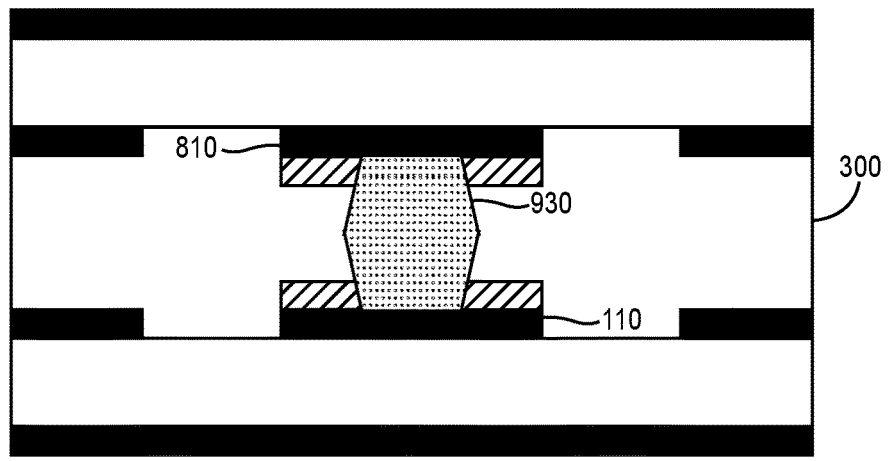

FIG. 9 is a cross-section view showing the first stack-up 100 joined to the third stack-up 800 by lamination. During this lamination, the SM 220, 820 in both stack-ups does not substantially melt or flow and inhibits resin of prepreg 300, 301 from obstructing the contact between conductive pastes 530, 830 and copper pads 110, 810. The conductive pastes 530, 830 are sintered during lamination and a monolithic, solid structure and electrical connection 930 is made between internal copper pads 110, 810.

Additional embodiments may include stack-ups alternatively including SM on one internal copper pad but not another followed by a combination of either embodiment (SM on both internal copper pads) for a successive layer in the PCB. There may be more than one connection made between stack-ups, by more than one method (conductive paste or through-hole vias, e.g.).

Overall, the method described herein enables a PCB, such as that shown in FIG. 7, to be manufactured to preserve electrical contact by preventing intrusion of prepreg resin in between conductive paste and copper pads. The additional layer of SM on the internal copper pad increases the board thickness slightly at the conductive paste location which increases the pressure during joining stack-up layers relative to nearby areas, resulting in a final conductive paste that is more intact and provides better connection. Additionally, the via depth or volume is increased compared to a via made where no internal SM is used because the cavity must go through the prepreg and the SM instead of just the prepreg and more conductive paste filling the cavity is available for joining the internal copper pads. Prepreg thickness on top of the SM is also thinner than the nearby area which further reduces the ability and chance that severe prepreg resin flowing into the via will occur because there is less prepreg in the immediate area of the via.

The SM restricts the flow of prepreg resin and the SM is adjacent the via to be used to connect the copper pads of the two stack-ups with conductive paste. The structure and process disclosed prevents prepreg resin from inhibiting electrical contact of the conductive material with the copper pad of the first stack-up. Electrical contact is also improved for connection to the second stack-up. More conductive material can be printed into the cavity and greater pressure between the second copper pad and the conductive paste will create a better contact during lamination and sintering. Also, a slope in the prepreg away from the cavity reduces the likelihood of prepreg resin inhibiting electrical contact with the second stack-up because the copper pad is made higher than the surrounding areas due to the presence of the SM on top of it.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present invention, disclosure, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of fabricating a primed circuit board, the method comprising:
   providing a first stack-up, wherein the first stack-up includes one or more electrically conductive layers and one or more electrically non-conductive layers;
   placing solder mask material on at least one copper pad of the first stack-up, wherein the at least one copper pad is exposed on a first surface of the first stack-up;
   placing a prepreg layer on the first surface of the first stack-up over the at least one copper pad;
   forming at least one cavity through the prepreg layer and the solder mask material to expose the at least one copper pad;
   placing conductive paste in the at least one cavity;
   aligning a second stack-up with the first stack-up, wherein the second stack-up includes one or more electrically conductive layers and one or more electrically non-conductive layers, such that the conductive paste aligns with a second copper pad of the second stack-up; and
   laminating the second stack-up to the first stack-up.

2. The method of claim 1, comprising:
   sintering the conductive paste.

3. The method of claim 1, comprising:
   curing the solder mask material.

4. The method of claim 1, comprising:
   curing the solder mask material; and
   sintering the conductive paste.

5. The method of claim 1, wherein the conductive paste includes copper.

6. The method of claim 1, wherein the conductive paste includes silver.

7. The method of claim 1, wherein the solder mask material includes epoxy liquid.

8. The method of claim 1, wherein the solder mask material includes liquid ink.

* * * * *